(12) United States Patent
Ha

(10) Patent No.: US 8,913,434 B2
(45) Date of Patent: Dec. 16, 2014

(54) NON-VOLATILE MEMORY DEVICE AND METHOD FOR DRIVING THE SAME

(71) Applicant: SK Hynix Inc., Icheon (KR)

(72) Inventor: Sung Joo Ha, Seongnam (KR)

(73) Assignee: SK Hynix Inc., Icheon (KR)

( * ) Notice: Subject to any disclaimer, the term of this patent is extended or adjusted under 35 U.S.C. 154(b) by 76 days.

(21) Appl. No.: 13/722,922

(22) Filed: Dec. 20, 2012

(65) Prior Publication Data

US 2013/0294166 A1    Nov. 7, 2013

(30) Foreign Application Priority Data

May 2, 2012   (KR) .................. 10-2012-0046209

(51) Int. Cl.
*G11C 16/26*   (2006.01)
*G11C 16/24*   (2006.01)
*G11C 16/04*   (2006.01)

(52) U.S. Cl.
CPC ............... *G11C 16/26* (2013.01); *G11C 16/24* (2013.01); *G11C 16/0483* (2013.01)
USPC ...................................... 365/185.17

(58) Field of Classification Search
CPC ........................................ G11C 16/26
See application file for complete search history.

(56) References Cited

U.S. PATENT DOCUMENTS

| 2009/0052241 | A1* | 2/2009 | Baek et al. | 365/185.03 |
| 2010/0329018 | A1* | 12/2010 | Joo | 365/185.18 |
| 2011/0019486 | A1* | 1/2011 | Jang et al. | 365/185.25 |
| 2011/0299342 | A1* | 12/2011 | Kang | 365/185.25 |

* cited by examiner

*Primary Examiner* — Hoai V Ho
*Assistant Examiner* — Min Huang

(57) ABSTRACT

A non-volatile memory device and a method for driving the same are disclosed. During a precharge operation, the bit line is precharged on the basis of a voltage applied to a common source line. The bit line is precharged or not precharged based on whether or not a selected memory cell is in an erased state or a program state.

23 Claims, 6 Drawing Sheets

NON-VOLATILE MEMORY DEVICE AND METHOD FOR DRIVING THE SAME

CROSS-REFERENCE TO RELATED APPLICATION

The priority of Korean patent application No. 10-2012-0046209 filed on May 2, 2012, the disclosure of which is hereby incorporated in its entirety by reference, is claimed.

BACKGROUND OF THE INVENTION

Embodiments of the present invention relate to a non-volatile memory device, and more particularly to a non-volatile memory device including a precharge drive circuit capable of minimizing power loss during a precharge operation, and a method for driving the same.

In recent times, as electronic devices have been increasingly miniaturized, many developer and companies are conducting intensive research into various technologies capable of providing superior portability and minimum power consumption to electronic devices.

In the case of a non-volatile memory device such as a flash memory, a plurality of memory cells are coupled to a bit line in a string shape, and data is written or programmed in units of one page, or is erased in units of one block. If the non-volatile memory device is operated in units of one page, a plurality of bit lines coupled to one word line are precharged, so that power consumption for precharging the bit lines is increased.

BRIEF SUMMARY OF THE INVENTION

Various embodiments of the present invention are directed to providing a non-volatile memory device and a method for driving the same that substantially obviate one or more problems due to limitations and disadvantages of the related art.

Embodiments of the present invention relate to a method for driving a non-volatile memory device to precharge at least one bit line by applying a voltage of a common source line to a memory string through a string selection transistor when reading data written in the non-volatile memory device, and determining whether to precharge the bit line on the basis of a program state of a selected memory cell, instead of precharging all the bit lines in units of a page, so that a current consumed for precharging can be minimized.

The embodiment of the present invention relates to a technology for precharging at least one bit line on the basis of a program state of a selected memory cell without precharging all the bit lines on a page basis, during a verification operation contained in a program operation of the non-volatile memory device, resulting in a reduction in a total program operation time in which the verification operation is sequentially carried out.

In accordance with an embodiment of the present invention, a non-volatile memory device includes a first memory string including a plurality of non-volatile memory cells coupled between a common source line and a first bit line, a first string selection transistor coupled between the common source line and the first memory string; and a precharge drive circuit configured to provide a first voltage to a gate terminal of the first string selection transistor and provide a second voltage to the common source line during a precharge operation, wherein the first string selection transistor provides the second voltage to the first memory string in response to the first voltage in order to precharge the first bit line, and wherein the first memory string is one of a plurality of memory strings in the non-volatile memory device.

The each of the non-volatile memory cells is coupled to a word line, and wherein the bit line is precharged if a threshold voltage of a selected non-volatile memory cell is lower than a word line selection voltage applied to a word line coupled to the selected non-volatile memory cell.

The first bit line may be precharged with a voltage proportional to a difference between the first voltage and a threshold voltage of the first string selection transistor.

The first bit line is not precharged if the threshold voltage of the selected non-volatile memory cell is higher than the word line selection voltage.

A word line non-selection voltage may be applied to unselected word lines that are coupled to unselected non-volatile memory cells in the first memory string, the word line selection voltage may corresponding to a ground voltage.

In some example embodiments of the present invention, the non-volatile memory device further includes a second memory string including a plurality of non-volatile memory cells coupled between the common source line and a second bit line; a second string selection transistor coupled between the common source line and the second memory string; and a page buffer coupled to the first and second memory strings.

The page buffer may be configured to detect a voltage of the any of the first and second bit lines in response to a read signal.

The page buffer may include a sense output unit configured to sense any of the voltage of the first and second bit lines, thereby generating the sensed voltage differently based on whether or not any of the first and second bit lines is precharged.

The non-volatile memory device may further include a data input/output (I/O) unit configured to determine data stored in a selected non-volatile memory device based on the sensed bit line voltage and a word line selection voltage.

The non-volatile memory cell may operate as a Single Level Cell (SLC) or a Multi Level Cell (MLC).

If the non-volatile memory cell may be configured to operate as the MLC, the precharge drive circuit may apply a word line selection voltage generated according to MLC threshold voltage distribution characteristics to a selected word line.

In accordance with another embodiment of the present invention, a method for driving a non-volatile memory device which includes memory string and a string selection transistor, the memory string including a plurality of non-volatile memory cells provided between a common source line and a bit line, the string selection transistor provided between the memory string and the common source line, wherein each non-volatile memory cell is coupled to a word line, includes, providing a first voltage to the string selection transistor during a precharge operation, providing a second voltage to the common source line during the precharge operation, applying a word line selection voltage to a selected word line, the selected word line being coupled to one of the non-volatile memory cells; and precharging the bit line by providing the second voltage to the memory string in response to the first voltage.

The non-volatile memory device includes a plurality of memory strings, each memory string being coupled to a string selection transistor. The precharging of the bit line may include: precharging the bit line if a threshold voltage of the non-volatile memory cell coupled to the selected word line is higher than the word line selection voltage, and not precharging the bit line if a threshold voltage of the non-volatile memory cell coupled to the selected word line is lower than the word line selection voltage.

The bit line may be precharged with a voltage proportional to a difference between the first voltage and a threshold voltage of the string selection transistor.

The method may further include, sensing and outputting a voltage of the bit line during a read operation.

The method may further include, determining data stored in the non-volatile memory cell coupled to the selected word line based on the sensed bit line voltage and the word line selection voltage.

The method may further include: precharging the bit line if the non-volatile memory cell coupled to the selected word line is in an erase state, and not precharging the bit line if the non-volatile memory cell coupled to the selected word line is in a program state.

The nonvolatile memory device may be a NAND flash memory device. The method may further include: if the non-volatile memory cell is a multi level cell (MLC), controlling the word line selection voltage according to a state distribution of the multi level cell (MLC).

The controlling of the word line selection voltage may include: in the multi level cell (MLC) having a plurality of threshold voltage distribution regions, determining a voltage between the threshold voltage distribution regions to be the word line selection voltage.

The word line non-selection voltage applied to the selected word lines is higher than the highest threshold voltage defined for the plurality of threshold voltage distribution regions.

In some example embodiments, a method for precharging a non-volatile memory device having a bit line, a common source line and a memory string that is provided between the bit line and the common source line, the method comprising: applying a first voltage to a gate terminal of a string selection transistor, the string selection transistor having first terminal coupled to the memory string and a second terminal coupled to the common source line; applying a second voltage to the second terminal of the string selection transistor via the common source line; and applying a word line selection voltage to a selected word line coupled to a gate terminal of a memory cell, the word line selection voltage having a voltage level sufficient to turn on the memory cell if the memory cell is a first state but insufficient to turn on the memory cell if the memory cell is in a second state, wherein the bit line is precharged if the memory cell is in the first state and not precharged if the memory cell is in the second state.

The non-volatile memory device is a NAND memory device and the first state is an erased state and the second state is a programmed state, and wherein the non-volatile memory device has a plurality of bit lines and a plurality of memory strings.

The method may further comprise applying a word line non-selection voltage to a plurality of word lines that are not selected, each the non-selected word lines being coupled to a gate terminal of one of the memory cells in the memory string, the word line non-selection voltage having a voltage level sufficient to turn on any of the memory cells in the memory sting whether or not it is in the first state or the second state.

It is to be understood that both the foregoing general description and the following detailed description of embodiments of the present invention are exemplary and explanatory and are intended to provide further explanation of the invention as claimed.

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

In association with embodiments of the present invention, specific structural and functional descriptions are disclosed for illustrative purposes only, embodiments of the present invention can be implemented in various ways without departing from the scope or spirit of the present invention.

Figure 1:
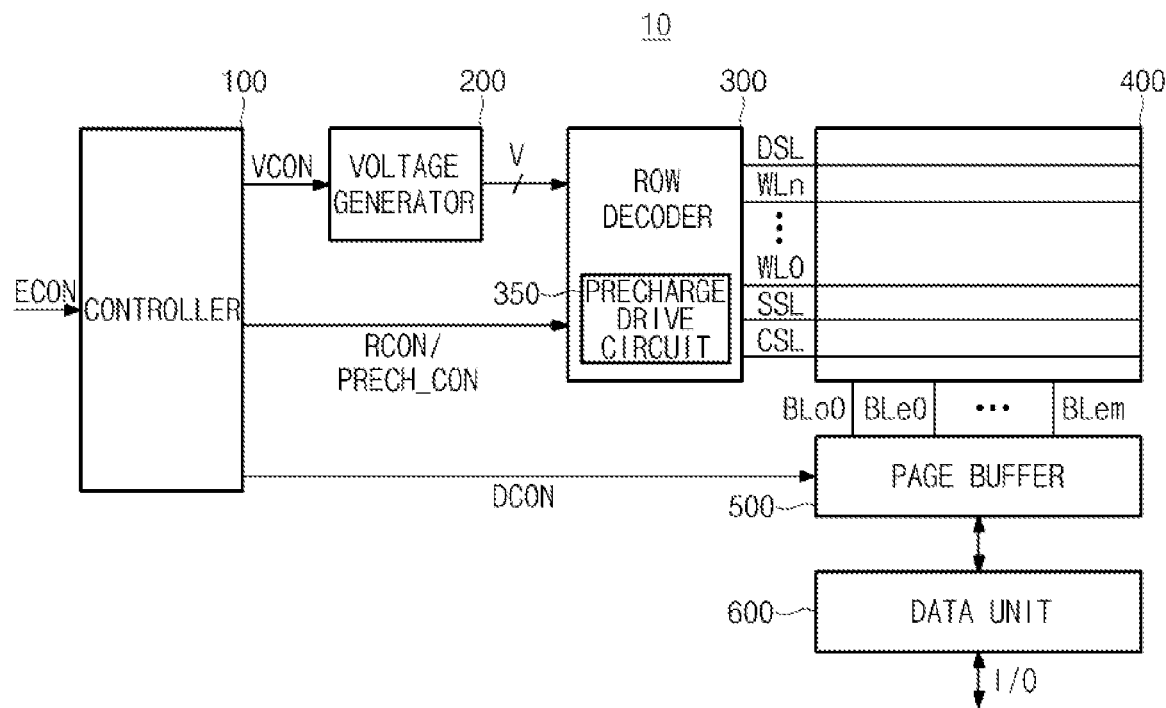
FIG. 1 is a block diagram illustrating a non-volatile memory device according to an embodiment of the present invention.

FIG. 1 is a block diagram illustrating a non-volatile memory device according to an embodiment of the present invention. An example of the non-volatile memory device includes a memory device in a NAND configuration such as a NAND Flash device.

Referring to FIG. 1, the non-volatile memory device 10 includes a controller 100, a voltage generator 200, a row decoder 300, a memory cell array 400, a page buffer 500, and a data input/output (I/O) unit 600.

The controller 100 receives an external control signal (ECON), such as an address or command, from an external device such as a host, and generates an internal control signal for controlling a read operation, a write operation, and/or a verify operation of the non-volatile memory device 10. The internal control signals may include a voltage control signal (VCON) provided to the voltage generator 200, a row control signal (RCON) provided to the row decoder 300, a precharge control signal (PRECH_CON) provided to a precharge drive circuit 350, and a data control signal (DCON) provided to the page buffer 500. In addition, the controller 100 provides a word line selection voltage (Vswl) to the data I/O unit 600 so that it can determine data written in a bit line (BL).

In an embodiment of the present invention, the external control signal (ECON) received by the controller 100 may include an address signal (ADDR) and a command signal (CMD). The address signal (ADDR) may be comprised of a row address signal (RADDR) and a column address signal (CADDR), and the row address signal (RADDR) may be provided to the row decoder 300 and the column address signal (CADDR) may be provided to a column decoder (not shown). The address signal (ADDR) may indicate access to a specific non-volatile memory cell. For example, a selected word line and an unselected word line are determined on the basis of the row address signal (RADDR).

The command signal (CMD) may indicate the operation of the non-volatile memory device 10. Therefore, the controller 100 may generate a program operation signal (PGM), a read operation signal (READ), an erase operation signal (ERASE), etc.

The voltage generator 200 receives the voltage control signal (VCON), so that it can provide a program voltage (Vpgm), a pass voltage (Vpass), a read voltage (Vread), a verification voltage (Vvrf), a power-supply voltage (Vcc), etc. In addition, the voltage generator 200 according to an embodiment of the present invention generates different voltages according to a distribution state of the non-volatile memory cells contained in the memory cell array 400, so that it can provide the various voltages that has different levels to the selected word line and the unselected word line. Such voltage generation will be described later with reference to FIGS. 4A and 4B.

The row decoder 300 provides a voltage received from the voltage generator 200 to the memory cell array 400. The row decoder 300 may include a precharge drive circuit 350. The precharge drive circuit 350 provides a first voltage (V1) to a string selection line (SSL), and provides a second voltage (V2) to a common source line (CSL). For example, the second voltage (V2) may correspond to a power-supply voltage (VDD), and the first voltage (V1) may have a different voltage level from a voltage enabling a word line.

In addition, the precharge drive circuit 350 may provide a word line selection voltage changed according to threshold voltage distribution of the non-volatile memory cell to the selected word line, and may provide a word line non-selection voltage to the unselected word line.

In addition, the precharge drive circuit 350 may be omitted from the row decoder 300, and may also be implemented separately.

The memory cell array 400 will hereinafter be described with reference to FIG. 2. The memory cell array 400 includes a plurality of memory strings (STRe0, STRo0, . . . , STRom). Each memory string (STRe0, STRo0, . . . , or STRom) includes a drain selection transistor (DSTo, DSTe), non-volatile memory cells (MCn, . . . , MC1, MC0), and a source selection transistor (SSTo, SSTe). An example of the non-volatile memory cells includes Flash memory cells. The drain selection transistor (DSTo, DSTe) is coupled between the bit lines (BLo0, BLe0, . . . , BLem) and a common source line (CSL). A memory string coupled to an odd bit line (BLo) is referred to as an odd memory string, and a memory string coupled to an even bit line (BLe) is referred to as an even memory string. An odd memory string (STRo) and an even memory string (STRe) form a pair of memory strings, and are coupled to the page buffer 500. That is, one memory string pair is coupled to a single page buffer circuit. In other embodiments, a single page buffer circuit may be coupled to only one memory string or more than two memory strings.

During the write operation, the page buffer 500 provides a write voltage (Vcc) or a ground voltage (Vss) to the corresponding bit lines of the memory cell array 400 upon receiving the data control signal (DCON), so that it can program a non-volatile memory cell by adjusting its threshold voltage. During the read operation, the page buffer 500 can detect a current or voltage of the bit line upon receiving the data control signal (DCON).

The conventional non-volatile memory device electrically couples the page buffer 500 to the bit line so as to directly provide the bit line with a power-supply voltage, thereby precharging all bit lines.

In contrast, during the precharge operation, the non-volatile memory device 10 according to an embodiment of the present invention blocks or severs an electrical path between the power-supply voltage terminal of the page buffer 500 and the bit line. Therefore, instead of precharging all the bit lines through the page buffer 500, the non-volatile memory device according to the present invention is configured to precharge bit lines through a common source line (CSL).

In an embodiment, during the precharge operation, using the string selection transistor (SSTo, SSTe) turned on in response to a first voltage (V1) received from the precharge drive circuit 350, the power-supply voltage is provided to the common source line (CSL) so that the bit lines can be precharged.

In the case of the precharge operation, a drain selection transistor (DSTo, DSTe) is also turned on, so that a current path may be formed through the non-volatile memory cells (MC0, MC1, . . . , MCn) between the string selection transistor (SST) and the drain selection transistor (DST). In this case, the word line non-selection voltage is provided to the unselected word lines to be turned on, and the word line selection voltage is provided to the selected word line. However, the word line selection voltage is changed according to a threshold voltage of a non-volatile memory cell coupled to the selected word line, such that the non-volatile memory cell coupled to the selected word line can be turned on or off according to the threshold voltage of the non-volatile memory cell and the word line selection voltage.

When programming the non-volatile memory cell contained in the memory cell array 400 according to an embodiment of the present invention, the non-volatile memory cell may have a threshold voltage higher than the word line selection voltage. Assuming that the non-volatile memory cell is in an erase state, the non-volatile memory cell may have a threshold voltage lower than the word line selection voltage. Therefore, it can be determined whether or not the non-volatile memory cell is programmed according to whether the non-volatile memory cell is turned on or off in response to the word line selection voltage.

For example, if the non-volatile memory cell coupled to the selected word line is turned on, the drain selection transistor (DSTo, DSTe), the string selection transistor (SSTo, SSTe), and the non-volatile memory cells connected in series to the memory string are turned on, so that the bit line is precharged with a voltage (V1-Vt) corresponding to a difference between a first voltage (V1) and a threshold voltage (Vt) of the string selection transistor (SSTo, SSTe).

On the other hand, if the non-volatile memory cell coupled to the selected word line is turned off, an electrical path between the common source line (CSL) and the bit line (BLo, BLe) is severed so that the bit line (BLo, BLe) is not precharged.

In a subsequent read operation, assuming that the bit line (BLo, BLe) is precharged to have a voltage level (V1-Vt) in the process for sensing a voltage of the bit line (BLo, BLe) through the page buffer 500, a non-volatile memory cell coupled between the corresponding bit line and the selected word line is in an erase state. Otherwise, assuming that the bit line is not precharged to have the ground voltage (Vss) level, a non-volatile memory cell coupled between the corresponding bit line and the selected word line is in a programmed state.

Differently from the conventional non-volatile memory device where all the bit lines are precharged irrespective of whether the memory cell is programmed, the non-volatile memory device 10 according to an embodiment of the present invention determines whether to precharge the bit lines according to whether or not a specific non-volatile memory cell is programmed, so that it can minimize a current needed for precharging. In accordance with an embodiment, if the non-volatile memory cell is a single level cell (SLC) capable of storing only one bit, the non-volatile memory cell may stochastically have only one state from among a program state and an erase state, so that a current for precharging can be cut in half as compared to the conventional non-volatile memory device.

Figure 2:
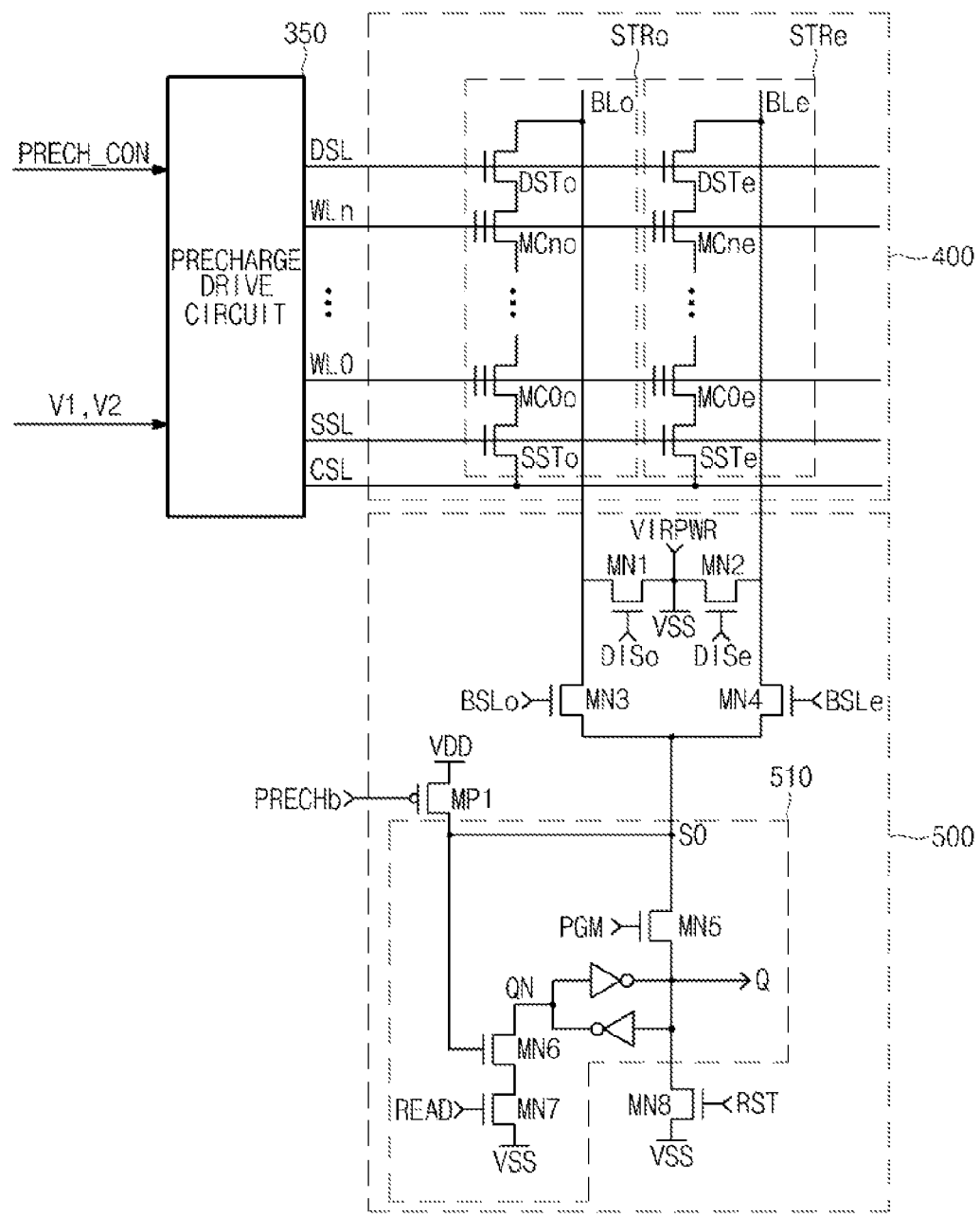
FIG. 2 is a detailed circuit diagram illustrating portions of the embodiment of the non-volatile memory device shown in FIG. 1.

FIG. 2 is a detailed circuit diagram illustrating portions of the non-volatile memory device shown in FIG. 1. For convenience of description and better understanding of the present invention, the memory strings contained in the memory cell array 400 shown in FIG. 2 are represented by an odd memory string and an even memory string (also referred to as a "memory string pair"). In order to express a detailed diagram of a single page buffer circuit coupled to a memory string pair, FIG. 2 shows only one page buffer circuit from among several page buffer circuits contained in the page buffer 500.

In response to the precharge control signal (PRECH_CON) the precharge drive circuit 350 provides the first voltage (V1) to the string selection line (SSL), and provides the second voltage (V2) to the common source line (CSL). The first voltage (V1) and the second voltage (V2) may be provided from the voltage generator 200 shown in FIG. 1. Although the first voltage (V1) is used to enable the source selection transistor (SST), it may have a different voltage level from a voltage enabling the word line. In addition, the second voltage (V2) may have a power-supply voltage (VDD) level. In order to differentiate between the first voltage (V1) and the second voltage (V2), a voltage for enabling the drain selection transistor (DST) will hereinafter be referred to as a third voltage (V3).

In addition, the precharge drive circuit 350 may also apply a voltage to a plurality of word lines (WL0, ..., WLn) and the drain selection line (DSL) of the memory cell array 400. The voltage applied to the word lines (WL0, ..., WLn) and the drain selection line (DSL) may be changed according to write characteristics (for example, the number of bits capable of being written in one non-volatile memory cell and threshold voltage distribution characteristics of a non-volatile memory in which data is written) of the non-volatile memory cell contained in the memory cell array 400. A detailed description of the above-mentioned operation will be described later with reference to FIGS. 4A and 4B.

The precharge operation to be described in an embodiment of the present invention may include a precharge operation for verifying a program of the non-volatile memory cell, a precharge operation for performing a read operation used to read data written in the non-volatile memory cell, and a bit line precharge operation used for an erase verification operation of the non-volatile memory cell.

The drain selection transistor (DSTo), non-volatile memory cells (MCno, ..., MC0o), and the string selection transistor (SSTo) are connected in series between the odd bit line (BLo) and the common source line (CSL). The above-mentioned components are generally referred to as an odd memory string (STRo).

The drain selection transistor (DSTe), non-volatile memory cells (MCne, ..., MC0e), and the string selection transistor (SSTe) are connected in series between the even bit line (BLe) and the common source line (CSL), thereby defining an even memory string (STRe).

Gate terminals of the drain selection transistors (DSTo and DSTe) are coupled to the drain selection line (DSL) so that the drain selection transistors (DSTo and DSTe) are turned on or off in response to the DSL output signal. Gate terminals of the source selection transistors (SSTo and SSTe) are coupled to the source selection line (SSL) so that the source selection transistors (SSTo and SSTe) are turned on or off in response to the SSL output signal. In addition, a first terminal of each of the source selection transistors (SSTe, SSTo) is connected to the common source line (CSL), so that an output voltage of the common source line (CSL) can be provided to memory cells (MC0o, MC0e) in response to an output voltage of the source selection line (SSL).

The page buffer 500 is coupled to bit lines (BLe, BLo), and can detect a voltage or current of each bit line.

The first NMOS transistor (MN1) and the second NMOS transistor (MN2) discharge a voltage level of a pair of bit lines (BLo, BLe). The first NMOS transistor (MN1) and the second NMOS transistor (MN2) are connected in series to the bit line pair (BLo, BLe), and a ground voltage (VSS) or a virtual voltage source (VIRPWR) may be connected to a node between the first NMOS transistor (MN1) and the second NMOS transistor (MN2). The first NMOS transistor (MN1) and the second NMOS transistor (MN2) may discharge at least one bit line from among the bit lines (BLo, BLe) in response to discharge signals (DISo, DISe), or may precharge the bit lines (BLo, BLe) by providing the virtual voltage source (VIRPWR).

A third NMOS transistor (MN3) and a fourth NMOS transistor (MN4) are used as bitline connection switch elements, so that the third NMOS transistor (MN3) is enabled by the bitline selection signal (BSLo) and the fourth NMOS transistor (MN4) is enabled by the bit line selection signal (BSLe). As described above, the conventional non-volatile memory device enables at least one of the bit line selection signals (BSLo, BSLe), receives a power-supply voltage (VDD) from the page buffer 500, and provides the power-supply voltage (VDD) to the bit lines (BL0, BLe), such that it can perform the precharge operation. However, according to an embodiment of the present invention, both of the bit line selection signals (BSLo, BSLe) are disabled during the precharge operation. In an embodiment, where three or more bit lines are grouped together, all of these bit lines are disables during the precharge operation.

The first PMOS transistor (MP1) can provide the power-supply voltage (VDD) to a sense node (S0) in response to a precharge enable signal (PRECHb). In the conventional precharge operation, the first PMOS transistor (MP1) provides the power-supply voltage (VDD) and the bit line connection switch elements are turned on or off in such a manner that a direct path for the bit lines (BLo and BLe) is provided, allowing the bit lines to be precharged. However, the non-volatile memory device 10 according to an embodiment of the present invention provides the power-supply voltage (VDD) to the sense node (S0) in response to the precharge enable signal (PRECHb) during the precharge operation, and does not provide the power-supply voltage (VDD) to the bit lines (BLo, BLe).

A fifth NMOS transistor (MN5) electrically couples the sense node (S0) to an I/O node (Q) in response to a program signal (PGM). For example, provided that data to be programmed is provided to the I/O node (Q) during the program operation, the fifth NMOS transistor (MN5) provides the data to the sense node (S0) so that the data can be written through the bit lines (BLo, BLe).

The I/O node (Q) is electrically coupled to an inverting I/O node (QN) with a data latch interposed therebetween, and the I/O node (Q) may be initialized to the ground voltage (VSS) by an eighth NMOS transistor (MN8) in response to a reset signal (RST).

A sixth NMOS transistor (MN6) includes a first terminal connected to the inverting I/O node (QN) and a gate connected to the sense node (S0). A seventh NMOS transistor (MN7) is connected between a second terminal of the sixth NMOS transistor (MN6) and the ground voltage (VSS), and is operated in response to a read signal (READ). In conclusion, the sixth NMOS transistor (MN6) and the seventh NMOS transistor (MN7) can provide the voltage of the sense node (S0) to the inverting I/O node (QN) in response to the read signal (READ).

The fifth to seventh NMOS transistors (MN5, MN6, MN7) and the data latch can detect an output voltage of the bit line in response to the read signal (READ), and provides the detected voltage to the I/O node (Q), so that the fifth to seventh NMOS transistors (MN5, MN6, MN7) and the data latch can be represented by a sense output unit 510.

Figure 3:
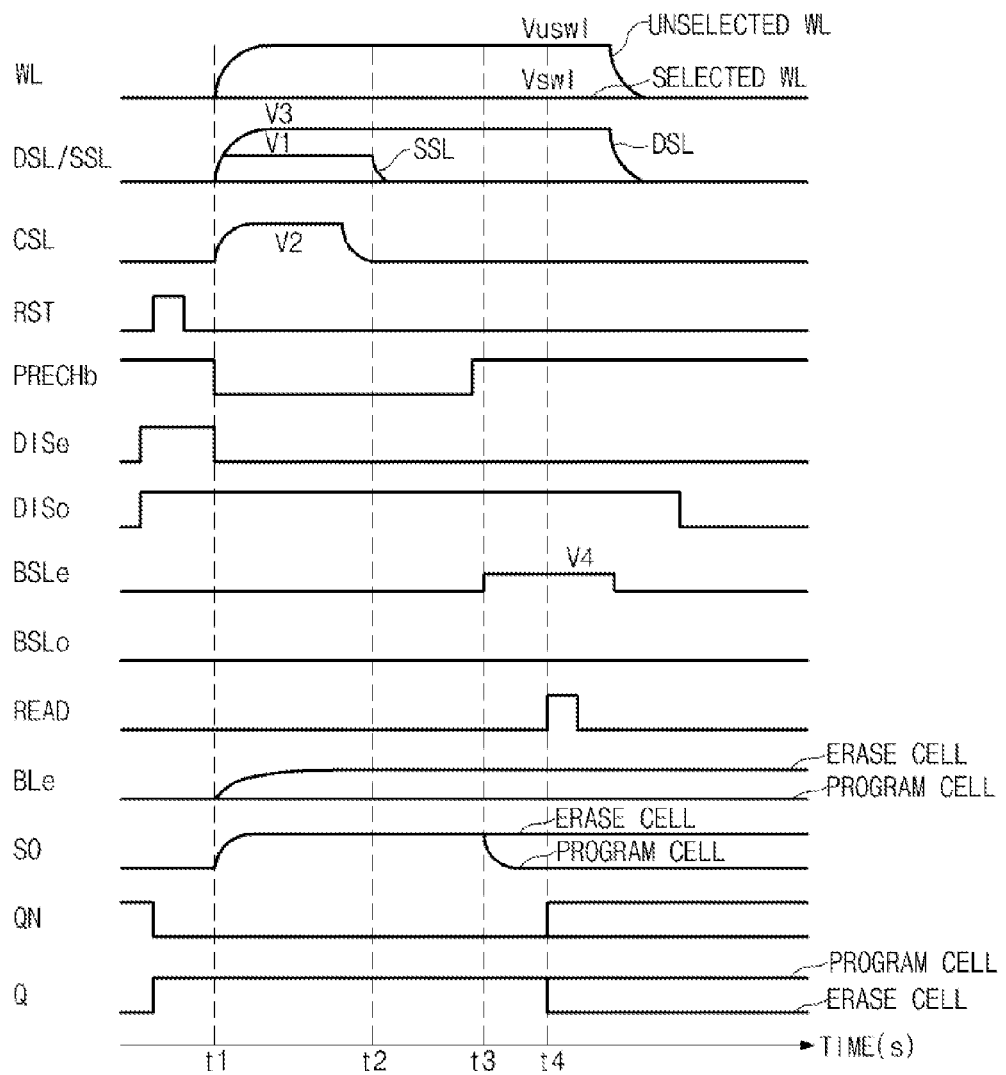
FIG. 3 is a view illustrating a timing diagram showing operation characteristics of a non-volatile memory device according to an embodiment of the present invention.

FIG. 3 is a view illustrating a voltage waveform showing operation characteristics of a non-volatile memory device according to an embodiment of the present invention. The operations of the non-volatile memory device according to an embodiment of the present invention will hereinafter be described with reference to FIGS. 1 to 3.

In an initial state, a plurality of word lines (WL), the drain selection line (DSL) and a common source line (CSL) may have a ground voltage (VSS) level. In response to the reset signal (RST), the I/O terminal (Q) and the inverting I/O terminal (QN) are initialized. In addition, the bit line pair (BLo, BLe) is initialized by enabling discharge signals (DISe, DISo).

In addition, the bit line selection signal (BSLe, BSLo) are disabled so that an electrical connection between the page buffer and the bit line other than the discharge switches is severed.

At a time point (t1), if the precharge enable signal (PRECHb) is enabled to a logic state 'LOW', the first PMOS transistor (MP1) is turned on so that the sense node (S0) is increased to the power-supply voltage (VDD) level. However, the third NMOS transistor (MN3) and the fourth NMOS transistor (MN4) used as the bit line connection units are turned off, so that the power-supply voltage (VDD) is not provided to the bit lines (BLe, BLo).

In addition, the first voltage (V1) is applied to the string selection line (SSL), and the second voltage (V2) is applied to the common source line (CSL). The first voltage (V1) and the second voltage (V2) generated by the voltage generator 200 may be provided through the precharge drive circuit 350.

In an embodiment, the second voltage (V2) may have a voltage level that is substantially identical to the power-supply voltage (VDD), and the first voltage (V1) may be changed according to a voltage level to be precharged to the bit line. The first voltage (V1) may be controlled by the controller 100.

In addition, a third voltage (V3) higher than the first voltage (V1) may be applied to the drain selection line (DSL). The third voltage (V3) may have a higher voltage than a threshold voltage of the drain selection transistor (DST).

In addition, a word line selection voltage (Vswl) is applied to a selected word line from among a plurality of word lines connected to the memory cell array 400. A word line non-selection voltage (Vuswl) is applied to the unselected word line. In an embodiment, the word line selection voltage (Vswl) may have the same voltage level as the ground voltage (VSS), and the word line non-selection voltage (Vuswl) may have a higher voltage than threshold voltages of the programmed non-volatile memory cells so that the programmed non-volatile memory cells can be turned on when the word line non-selection voltage (Vuswl) is applied.

Since the even discharge signal (DISe) is enabled and the enable state is maintained, the odd bit line (BLo) is not precharged although the second voltage (V2) is provided to the common source line (CSL).

Therefore, the string selection transistor (SSTe) and the drain selection transistor (DSTe) coupled to the even bit line (BL2), and non-volatile memory cells connected to the unselected word lines are turned on. Provided that a non-volatile memory cell connected to the selected word line is turned on, a current path is formed through the even memory strings. A voltage corresponding to a voltage difference between the first voltage (V1) and the threshold voltage (Vt) of the string selection transistor is precharged to the even bit line (BLe). For example, if a threshold voltage of the non-volatile memory cell connected to the selected word line ("selected non-volatile memory cell") is lower than the word line selection voltage, the bit line is precharged. In other words, if the selected non-volatile memory cell is in an erase state, the bit line can be precharged.

On the other hand, if a threshold voltage of the selected non-volatile memory cell is higher than the word line selection voltage because it is in a programmed state, the selected non-volatile memory cell would not turned on by the word line selection voltage, and a current path between the bit line (BLe) and the common source line (CSL) would be severed. The bit line, therefore, would not be precharged.

As explained above, the non-volatile memory device according to an embodiment of the present invention controls the unselected non-volatile memory cells to be turned on in response to the word line non-selection voltage, and turns on the drain selection transistor (DST) and the string selection transistor (SST). In addition, a suitable voltage value is applied to the selected word line, so that the selected non-volatile memory cell can be turned on or not turned on according to its threshold voltage value, i.e., whether it is in an erased state or programmed state. If the selected non-volatile memory cell is in an erased state, the selected non-volatile memory cell would turn on upon being applied with the word line selection voltage (Vswl) since its threshold voltage would be lower than the word line selection voltage (Vswl). The common source line (CSL) would be electrically coupled to the bit line (BL), and the bit line (BL) would be precharged. If, however, the selected non-volatile memory cell is in a programmed state, the selected non-volatile memory cell would not turn on when the word line selection voltage (Vswl) is applied since its threshold voltage would be higher than the word line selection voltage (Vwsl). The common source line (CSL) would not be electrically coupled to the bit line, and the bit line would not be precharged.

In embodiments of the present invention, precharging or non-precharging of the bit line is based on a threshold voltage of the selected non-volatile memory cell. This minimizes the current or voltage required for precharging compared to the conventional non-volatile memory device that precharges all the bit lines including the selected non-volatile memory cell that is in a programmed state. Such a reduction in the current or voltage requirement in the NAND flash memory device can be significant reduction in power usage since precharging is performed typically for write, read, and verify operation on a page basis, where each page comprises a plurality of memory cells and each memory cell thereof is connected to a bit line. Therefore, the NAND flash memory device will see significant reduction in power usage by implementing the precharging embodiments disclosed herein.

Referring back to FIG. 3, at a time point (t2). a voltage difference between an erase cell and a program cell occurs due to the precharging of the even bit line (BLe), the ground voltage (VSS) is applied to the string selection line (SSL) so that the string selection transistor (SST) is turned off and the common source line (CSL) is transitioned to the ground voltage (VSS). An electrical connection between the bit line (BLe) and the common source line (CSL) is severed The bit line (BL2) is floated and provided with a precharge voltage.

Accordingly, the end of the time point (t2) may be seen as the end of the precharge operation.

At a time point (t3), the precharge enable signal (PRECHb) is disabled so that the sense node (S0) maintains the same power-supply voltage (VDD) as when the bit line (BL2) was precharged. In contrast, at the time point (t3), the even bit line selection signal (BSLe) is enabled and the voltage of the precharged bit line (BLe) is sensed. If the even bit line (BLe) is precharged, the voltage of the sense node (S0) is maintained at the same voltage as the power-supply voltage (VDD). If, on the other hand, the even bit line (BL2) is not precharged, the sense node (S0) is discharged to the ground voltage (VSS) level. Therefore, a voltage value of the sense node (S0) would be different depending on whether or not the even bit line (BL2) has been precharged at the time point (t2), i.e., whether or not the selected non-volatile memory cell is in an erased state or in a programmed state.

Thereafter, if a read signal (READ) is enabled at a time point (t4), the voltage of the I/O node (Q) is determined through the latch according to the voltage of the sense node (S0).

In the above, the embodiments of the present invention have been described in terms of a memory device having non-volatile memory cells that are Single Level Cells (SLCs). The word line non-selection voltage (Vuswl) indicates a case in which the non-volatile memory cell has a higher threshold voltage than another non-volatile memory cell having a program state, and the word line selection voltage (Vswl) is substantially the same as the ground voltage (VSS). In addition, assuming that it is possible to determine whether the non-volatile memory cell is programmed or erased, a current state of the non-volatile memory cell can be recognized.

Figure 4A:
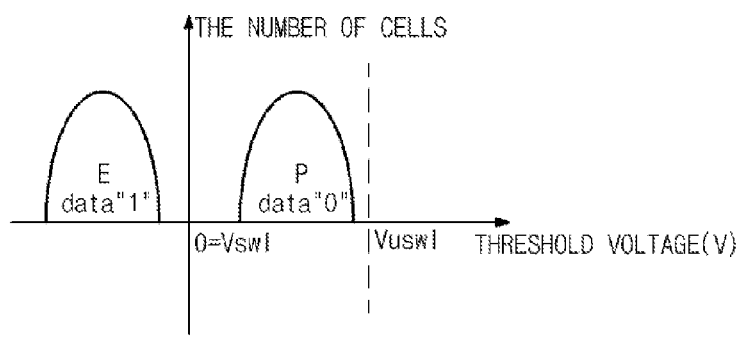
FIG. 4A is a graph illustrating a distribution of threshold voltages when a non-volatile memory cell is a Single Level Cell (SLC)
Figure 4B:
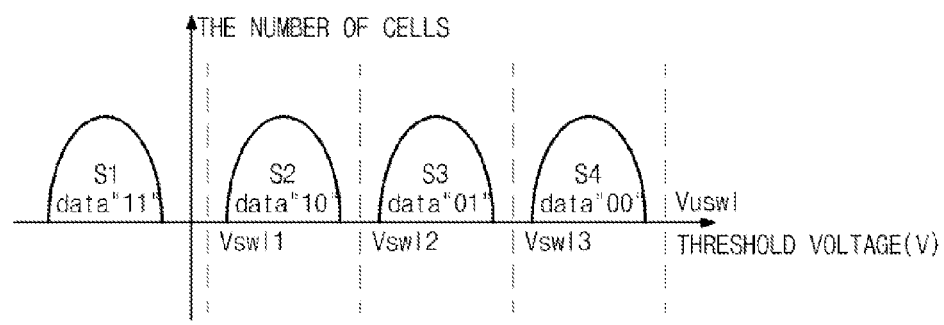
FIG. 4B is a graph illustrating a distribution of threshold voltages when a non-volatile memory cell is a Multi Level Cell (MLC).

FIG. 4A is a graph illustrating a distribution of threshold voltages when a non-volatile memory cell is a Single Level Cell (SLC). FIG. 4B is a graph illustrating a distribution of threshold voltages when a non-volatile memory cell is a Multi Level Cell (MLC). In FIGS. 4A and 4B, an X axis represents a threshold voltage (V) and a Y axis represents the number of cells.

Provided that a non-volatile memory cell is an SLC, the word line selection voltage (Vswl) and the ground voltage (VSS) may have substantially the same voltage level so as to discriminate between an erase state (E) and a program state (P). In addition, the word line non-selection voltage (Vuswl) is established to be higher than the highest threshold voltage of the non-volatile memory cells so that the word line non-selection voltage (Vuswl) can turn on a non-volatile memory cell whether it is programmed or erased.

In the non-volatile memory device 10 according to an embodiment of the present invention, the word line selection voltage (Vswl) and the word line non-selection voltage (Vuswl) are determined by the controller 100 so as to generate a voltage generation control signal (VCON), so that the voltage generation control signal (VCON) can be generated by the voltage generator 200.

FIG. 4B is a graph illustrating distribution of threshold voltages when a non-volatile memory cell is a Multi Level Cell (MLC) capable of storing data of at least two bits.

Referring to FIG. 4B, non-volatile memory cells have a threshold voltage distribution composed of four states S1, S2, S3 and S4. In order to discriminate among the four states S1 to S4, first, second, and third word line selection voltages (Vswl1, Vswl2, Vswl3) may be used. However, the word line non-selection voltage (Vuswl) may have a higher voltage than the highest threshold voltage of the non-volatile memory cells.

For example, if the selected non-volatile memory cell is in the S3 state, i.e., if a threshold voltage of the selected non-volatile memory cell is located in the S3 region, the selected non-volatile memory cell is turned on when the third word line selection voltage (Vswl3) is provided to the selected word line, so that the bit line (BL) is precharged.

However, if the first or second word line selection voltage (Vswl1, Vswl2) is applied to the selected word line, the bit line (BL) is not precharged, so that the bit line has a ground voltage (VSS) level under the condition that the read signal (READ) is actually enabled and the bit line voltage is sensed through the sense node (S0) and the I/O node (Q). Thereafter, after the bit line (BL) is precharged by the third word line selection voltage (Vswl3), a voltage of the sense node (S0) and a voltage of the I/O node (Q) are proportional to a voltage difference between the first voltage (V1) and a threshold voltage of the string selection transistor (SST).

In another example, if the selected non-volatile memory cell is in the S2 state, i.e., if a threshold voltage of the selected non-volatile memory cell is in the S2 region, the following operations can be achieved. In more detail, the selected non-volatile memory cell is turned on when either of the second and third word line selection voltages (Vswl2, Vswl3) is applied to the selected word line, so that the bit line (BL) is precharged. If a first word line selection voltage (Vswl1) is provided to the selected word line, the selected non-volatile memory cell is not turned on so that the bit line (BL) is not precharged.

Therefore, if a first word line selection voltage (Vswl1) is applied to the non-volatile memory cell during the precharge operation, each of the sense node (S0) and the I/O node (Q) has a ground voltage (VSS) level during the read operation. Subsequently, if the second or third word line selection voltage (Vswl2, Vswl3) is applied to the non-volatile memory cell, output voltages of the sense node (S0) and the I/O node (Q) are proportional to a difference between the first voltage (V1) and a threshold voltage of the string selection transistor (SST).

In addition, assuming that the selected non-volatile memory cell is in the S4 state, none of the first, second, and third word line selection voltages (Vswl1, Vswl2, Vswl3) would turn on the non-volatile memory cell and the bit line would not be precharged.

Therefore, if the non-volatile memory cell is an MLC, it is possible to determine data according to an output value of the word line selection voltage (Vswl) and an output voltage of the I/O node (Q). However, it may be difficult to recognize data written in the non-volatile memory cell on the basis of a single precharge operation and associated information indicating a precharge or non-precharge state.

The data I/O unit 600 of the non-volatile memory device 10 according to an embodiment of the present invention can determine data written in the non-volatile memory cell based on the voltage sensed by the word line selection voltage (Vswl) and the I/O node (Q).

Figure 5:
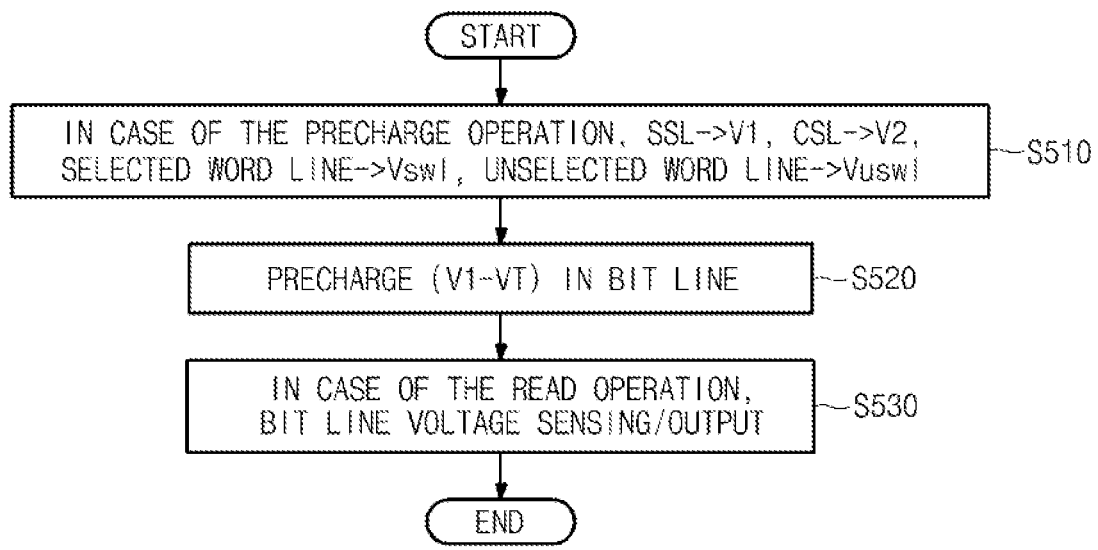
FIG. 5 is a flowchart illustrating a method for driving a non-volatile memory device according to an embodiment of the present invention.

FIG. 5 is a flowchart illustrating a method for driving a non-volatile memory device according to an embodiment of the present invention.

Referring to FIG. 5, during the precharge operation, the first voltage (V1) is applied to the string selection line (SSL), the second voltage is applied to the common source line (CSL), the word line selection voltage (Vswl) is applied to the selected word line, and the word line non-selection voltage (Vuswl) is applied to the unselected word line at step S510. In accordance with an embodiment of the present invention, the third voltage (V3) may be provided to the drain selection line (DSL).

Individual voltages may be controlled on the basis of a voltage generation control signal (VCON) or a precharge control signal (PRECH_CON) of the controller 100 shown in FIG. 1.

If the above-mentioned voltages are applied to the non-volatile memory device through the precharge drive circuit 350, a voltage proportional to a difference between the first voltage (V1) and a threshold voltage of the string selection transistor (SST) is precharged in the bit line in response to a precharge operation signal such as a precharge enable signal (PRECHb) at step S520.

In response to the precharge operation signal such as the precharge enable signal (PRECHb), a voltage proportional to a difference between the first voltage (V1) and the threshold voltage of the string selection transistor (SST) is precharged in the bit line at step S520.

However, in the operation for precharging a voltage in the bit line, information indicating whether precharging of the bit line is actually executed is determined according to the relationship between a threshold voltage of the non-volatile memory cell connected to the selected word line and the word line selection voltage (Vswl). In more detail, the bit line is precharged only when the word line selection voltage (Vswl) is higher than a threshold voltage of the non-volatile memory cell connected to the selected word line.

In response to a read operation signal such as a read signal (READ), a voltage of the bit line is sensed and output at step S530.

However, in the case where the non-volatile memory cell is an MLC, it is difficult to determine data written in the non-volatile memory cell based on only specific information indicating whether the bit line is precharged as previously described in connection with FIG. 4B. Therefore, after the operation for sensing/outputting the voltage of the bit line, the method for driving the non-volatile memory device may further include an operation for determining data of the non-volatile memory cell.

Figure 6:
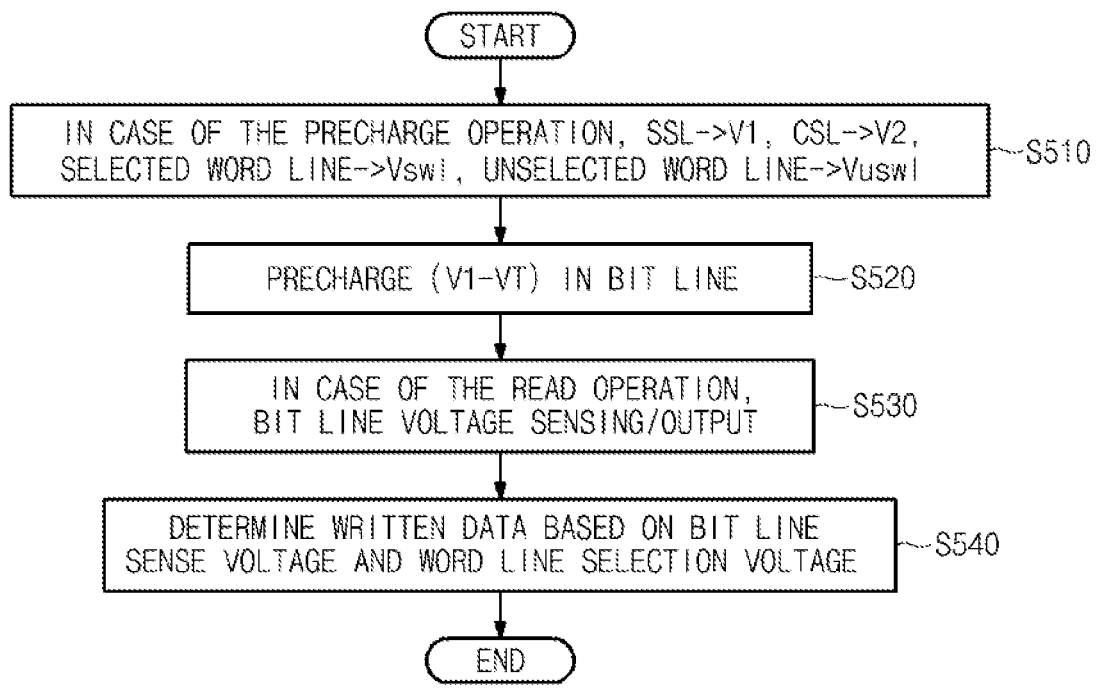
FIG. 6 is a flowchart illustrating a method for driving a non-volatile memory device including MLC non-volatile memory cells according to an embodiment of the present invention.

FIG. 6 is a flowchart illustrating a method for driving a non-volatile memory device including MLC non-volatile memory cells according to an embodiment of the present invention.

Referring to FIG. 6, although steps S510 to S530 are substantially identical to those of FIG. 5, the method for driving the non-volatile memory device may further include determining data of the non-volatile memory cell connected to the selected word line on the basis of not only a voltage sensed by the bit line but also the word line selection voltage (Vswl) at step S540.

As described above, a threshold voltage distribution for use in a first case wherein the non-volatile memory cell connected to the selected word line is turned on in response to the word line selection voltage (Vswl) and the bit line is thus precharged may be different from a threshold voltage distribution for use in a second case wherein the non-volatile memory cell connected to the selected word line is turned off and thus the bit line is not precharged, so that data can be finally determined according to the determination result.

The separate data I/O unit 600 contained in the non-volatile memory device 10 shown in FIG. 1 can determine data written in the non-volatile memory cell. For example, it is determined that a threshold voltage of the corresponding non-volatile memory cell is contained in a boundary region wherein information indicating whether the bit line is precharged is differently changed, on the basis of the plurality of word line selection voltages (Vswl). In more detail, although the bit line is not precharged in response to the second word line selection voltage (Vswl2) shown in FIG. 4B, if the bit line is precharged in response to the third word line selection voltage (Vswl3), it is determined that the non-volatile memory cell connected to the selected word line is in the S3 state between the second word line selection voltage (Vswl2) and the third word line selection voltage (Vswl3) in such a manner that data '01' is written in the above-mentioned non-volatile memory cell.

The method for driving the non-volatile memory device according to an embodiment of the present invention can be applied to the precharge operation and associated read operation, such that it can also be applied to a verification operation between Incremental Step Pulse Program (ISPP) operations from among the program operation. Therefore, in the non-volatile memory device which requests a plurality of verification operations during only one program process, a current or voltage required for precharging can be minimized.

As described above, the non-volatile memory device according to the embodiments of the present invention controls a voltage applied to the common source line (CSL) and the string selection line (SSL), such that the bit line can be precharged through the common source line (CSL). Information as to whether the precharge operation is substantially executed can be determined according to a threshold voltage of the non-volatile memory device connected to the selected word line. In conclusion, the method for driving the non-volatile memory device can reduce a current or voltage required for precharging without significantly changing the configuration of the non-volatile memory device.

Furthermore, the method for driving the non-volatile memory device according to an embodiment of the present invention does not precharge all the bit lines in units of a page, precharges the bit lines in response to a threshold voltage of the selected non-volatile memory device, and determines data on the basis of precharging or non-precharging of the bit line, so that the operation speed of an overall memory can be improved.

As is apparent from the above description, during the precharge operation, the non-volatile memory device according to the embodiments of the present invention is configured to precharge either bit lines coupled to erase cells from among a plurality of memory cells connected to the same word line, or bit lines coupled to non-volatile memory cells each having a threshold voltage lower than a word line selection voltage applied to a selected word line, so that a time consumed for precharging is minimized, resulting in a reduction of the operation time.

The non-volatile memory device according to the embodiments of the present invention can reduce power consumption for precharging, such that it can be applied to electronic appliances for which a portable power-supply unit is needed.

The method for driving the non-volatile memory device according to the embodiments of the present invention can minimize the precharge time required for the read and verification operations, so that the total operation time of the non-volatile memory device can be reduced.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A non-volatile memory device comprising:
a first memory string including a plurality of non-volatile memory cells coupled between a common source line and a first bit line, the first memory string being one of a plurality of memory strings in the non-volatile memory device;
a first string selection transistor coupled between the common source line and the first memory string;
a precharge drive circuit configured to provide a first voltage to a gate terminal of the first string selection transistor and provide a second voltage to the common source line during a precharge operation; and
a controller configured to determine a word line selection voltage having a voltage level sufficient to turn on a memory cell coupled to a selected word line if the memory cell is in a first state but insufficient to turn on the memory cell if the memory cell is in a second state,
wherein the first string selection transistor provides the second voltage to the first memory string in response to the first voltage in order to precharge the first bit line, and
wherein the first bit line is precharged if the memory cell is in the first state and not precharged if the memory cell is in the second state.

2. The non-volatile memory device according to claim 1, wherein the first bit line is precharged if a threshold voltage of the memory cell is lower than the word line selection voltage applied to the selected word line.

3. The non-volatile memory device according to claim 1, wherein the first bit line is precharged with a voltage proportional to a difference between the first voltage and a threshold voltage of the first string selection transistor.

4. The non-volatile memory device according to claim 1, wherein the first bit line is not precharged if a threshold voltage of the memory cell is higher than the word line selection voltage.

5. The non-volatile memory device according to claim 1, wherein a word line non-selection voltage is applied to unselected word lines that are coupled to unselected non-volatile memory cells in the first memory string, the word line selection voltage corresponding to a ground voltage.

6. The non-volatile memory device according to claim 1, further comprising:
a second memory string including a plurality of non-volatile memory cells coupled between the common source line and a second bit line;
a second string selection transistor coupled between the common source line and the second memory string; and
a page buffer coupled to the first and second memory strings.

7. The non-volatile memory device according to claim 6, wherein the page buffer is configured to detect a voltage of any of the first and second bit lines in response to a read signal.

8. The non-volatile memory device according to claim 7, wherein the page buffer includes:
a sense output unit configured to sense the voltage of any of the first and second bit lines, thereby generating the sensed bit line voltage differently based on whether or not any of the first and second bit lines is precharged.

9. The non-volatile memory device according to claim 8, further comprising:
a data input/output (I/O) unit configured to determine data stored in a selected non-volatile memory cell based on the sensed bit line voltage and a word line selection voltage.

10. The non-volatile memory device according to claim 1, wherein the non-volatile memory cell is configured to operate as a Single Level Cell (SLC) or a Multi Level Cell (MLC).

11. The non-volatile memory device according to claim 10, wherein if the non-volatile memory cell is configured to operate as the MLC, the precharge drive circuit applies a word line selection voltage generated according to MLC threshold voltage distribution characteristics to a selected word line.

12. A method for driving a non-volatile memory device which includes a memory string and a string selection transistor, the memory string including a plurality of non-volatile memory cells provided between a common source line and a bit line, the string selection transistor provided between the memory string and the common source line, wherein each non-volatile memory cell is coupled to a word line, the method comprising:
providing a first voltage to a gate terminal of the string selection transistor during a precharge operation;
providing a second voltage to the common source line during the precharge operation;
determining a word line selection voltage between threshold voltage distribution regions having a voltage level to turn on or turn off a non-volatile memory cell coupled to a selected word line according to whether the non-volatile memory cell is in a first state or a second state;
applying the word line selection voltage to the selected word line, the selected word line being coupled to one of the non-volatile memory cells; and
precharging the bit line by providing the second voltage to the memory string in response to the first voltage,
wherein the bit line is precharged if the non-volatile memory cell is in the first state and not precharged if the non-volatile memory cell is in the second state.

13. The method according to claim 12, wherein the non-volatile memory device includes a plurality of memory strings, each memory string being coupled to a string selection transistor, wherein the precharging of the bit line includes:
precharging the bit line if a threshold voltage of the non-volatile memory cell coupled to the selected word line is higher than the word line selection voltage; and
not precharging the bit line if the threshold voltage of the non-volatile memory cell coupled to the selected word line is lower than the word line selection voltage.

14. The method according to claim 12, wherein the bit line is precharged with a voltage proportional to a difference between the first voltage and a threshold voltage of the string selection transistor.

15. The method according to claim 12, further comprising:
sensing and outputting a voltage of the bit line during a read operation.

16. The method according to claim 15, further comprising:
determining data stored in the non-volatile memory cell coupled to the selected word line based on the sensed bit line voltage and the word line selection voltage.

17. The method according to claim 12, further comprising:
precharging the bit line if the non-volatile memory cell coupled to the selected word line is in an erase state, and
not precharging the bit line if the non-volatile memory cell coupled to the selected word line is in a program state.

18. The method according to claim 12, wherein the non-volatile memory device is a NAND flash memory device, the method further comprising:
if the non-volatile memory cell is a multi level cell (MLC), controlling the word line selection voltage according to a state distribution of the multi level cell (MLC).

19. The method according to claim 18, wherein the controlling of the word line selection voltage includes:
in the multi level cell (MLC) having a plurality of threshold voltage distribution regions, determining a voltage between the threshold voltage distribution regions to be the word line selection voltage.

20. The method according to claim 19, wherein a word line non-selection voltage applied to unselected word lines is higher than the highest threshold voltage defined for the plurality of threshold voltage distribution regions.

21. A method for precharging a non-volatile memory device having a bit line, a common source line and a memory string that is provided between the bit line and the common source line, the method comprising:
applying a first voltage to a gate terminal of a string selection transistor, the string selection transistor having a first terminal coupled to the memory string and a second terminal coupled to the common source line;
applying a second voltage to the second terminal of the string selection transistor via the common source line; and
applying a word line selection voltage to a selected word line coupled to a gate terminal of a memory cell, the word line selection voltage having a voltage level sufficient to turn on the memory cell if the memory cell is in a first state but insufficient to turn on the memory cell if the memory cell is in a second state,
wherein the bit line is precharged if the memory cell is in the first state and not precharged if the memory cell is in the second state.

22. The method of claim 21, wherein the non-volatile memory device is a NAND memory device, the first state is an erased state, and the second state is a programmed state, and
wherein the non-volatile memory device has a plurality of bit lines and a plurality of memory strings.

23. The method of claim 21, further comprising:
applying a word line non-selection voltage to a plurality of word lines that are not selected, each of the non-selected word lines being coupled to a gate terminal of a corresponding one of the memory cells in the memory string, the word line non-selection voltage having a voltage level sufficient to turn on any of the memory cells in the memory sting according to whether or not the memory cell is in the first state or the second state.

* * * * *